United States Patent
Lu et al.

(10) Patent No.: US 7,393,780 B2
(45) Date of Patent: Jul. 1, 2008

(54) DUAL LAYER BARRIER FILM TECHNIQUES TO PREVENT RESIST POISONING

(75) Inventors: Hong-Qiang Lu, Fremont, CA (US); Wei-Jen Hsia, Sunnyvale, CA (US); Wilbur G. Catabay, Saratoga, CA (US)

(73) Assignee: LSI Corporation, Milpitas, CA (US)

( * ) Notice: Subject to any disclaimer, the term of this patent is extended or adjusted under 35 U.S.C. 154(b) by 33 days.

(21) Appl. No.: 11/418,873

(22) Filed: May 4, 2006

(65) Prior Publication Data

US 2006/0205203 A1 Sep. 14, 2006

Related U.S. Application Data

(60) Division of application No. 10/893,659, filed on Jul. 16, 2004, now Pat. No. 7,071,094, which is a continuation of application No. 09/896,363, filed on Jun. 28, 2001, now Pat. No. 6,812,134.

(51) Int. Cl.
*H01L 21/4763* (2006.01)
(52) U.S. Cl. .................. 438/638; 438/627; 438/637; 438/702
(58) Field of Classification Search .......... 438/627, 438/637, 638, 702
See application file for complete search history.

(56) References Cited

U.S. PATENT DOCUMENTS

| | | | |
|---|---|---|---|
| 6,177,364 B1 | 1/2001 | Huang | |
| 6,251,770 B1 | 6/2001 | Uglow et al. | |
| 6,338,874 B1 | 1/2002 | Law et al. | |
| 6,383,913 B1 | 5/2002 | Tsai et al. | |
| 6,429,121 B1 | 8/2002 | Hopper et al. | |
| 6,465,889 B1 | 10/2002 | Subramanian et al. | |
| 6,486,059 B2 | 11/2002 | Lee et al. | |
| 6,521,524 B1 | 2/2003 | Wang et al. | |
| 6,756,672 B1 * | 6/2004 | You et al. | 257/751 |
| 6,812,134 B1 | 11/2004 | Lu et al. | |
| 6,909,190 B2 | 6/2005 | Uglow et al. | |
| 2002/0027286 A1 | 3/2002 | Sundararajan et al. | |
| 2002/0106068 A1 | 8/2002 | Chung | |
| 2002/0171147 A1 | 11/2002 | Yew et al. | |
| 2002/0182853 A1 | 12/2002 | Chen et al. | |
| 2003/0077897 A1 | 4/2003 | Tsai et al. | |
| 2003/0089987 A1 | 5/2003 | Parikh | |

* cited by examiner

*Primary Examiner*—Fernando L Toledo
(74) *Attorney, Agent, or Firm*—Beyer Law Group LLP

(57) ABSTRACT

Provided is a process for forming a barrier film to prevent resist poisoning in a semiconductor device by depositing a second nitrogen-free barrier layer on top of a first barrier layer containing nitrogen. A low-k dielectric layer is formed over the second barrier layer. This technique maintains the low electrical leakage characteristics of the first barrier layer and reduces nitrogen poisoning of a photoresist layer subsequently applied.

6 Claims, 7 Drawing Sheets

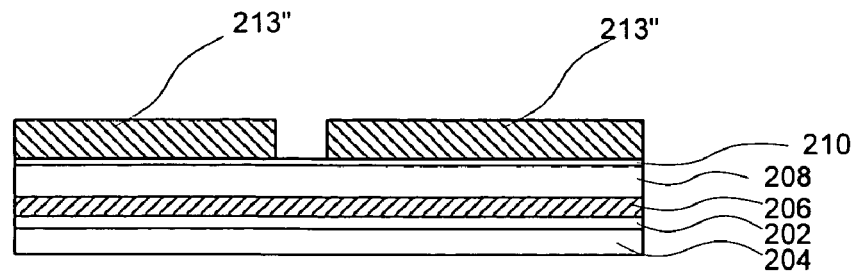
FIG. 2E"
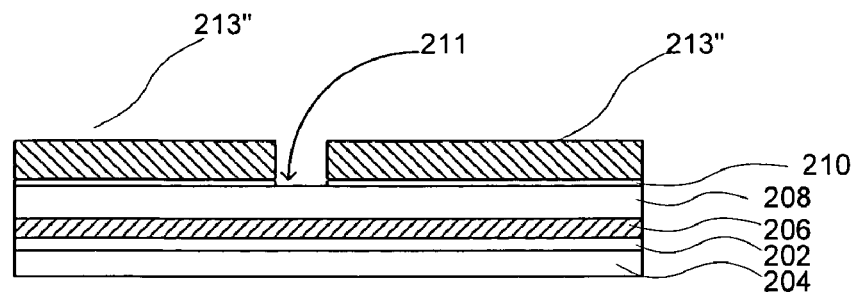
FIG. 2F"
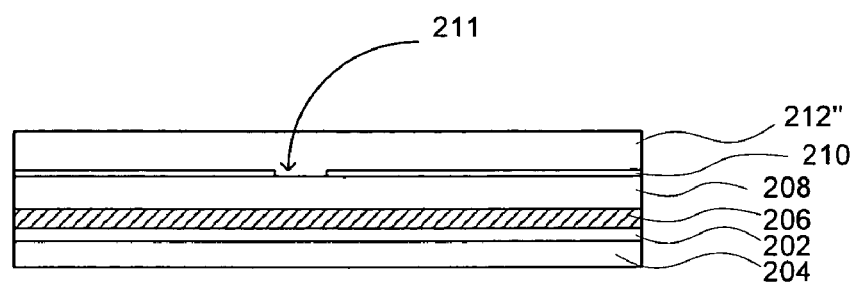
FIG. 2G"
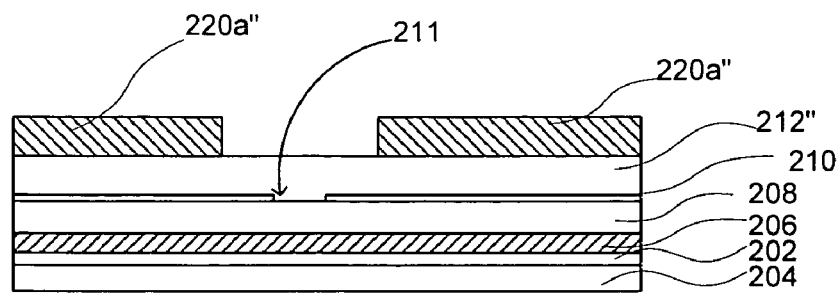
FIG. 2H"

Resist poisoning using std. N incorporated SiC barrier film
After trench patterning
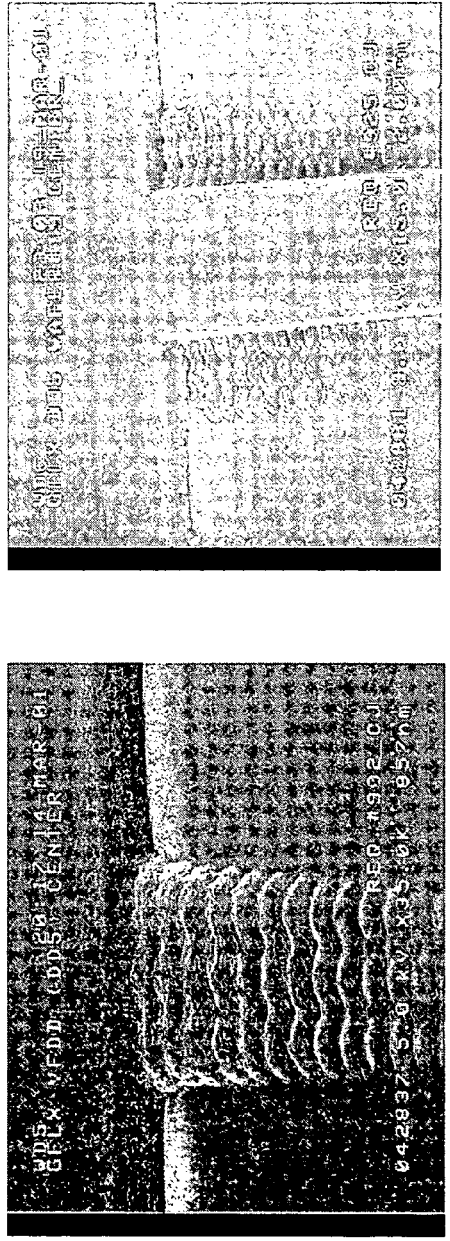
FIG. 3A
FIG. 3B
After trench etch
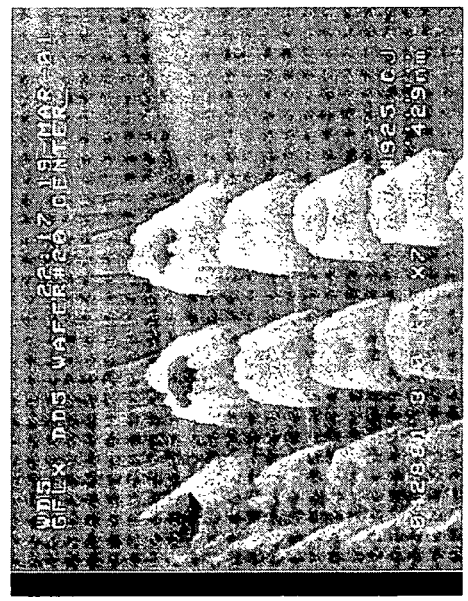
FIG. 3C Resist poison was solved by using 2-layer barrier stack in which top layer is N free.
After trench patterning
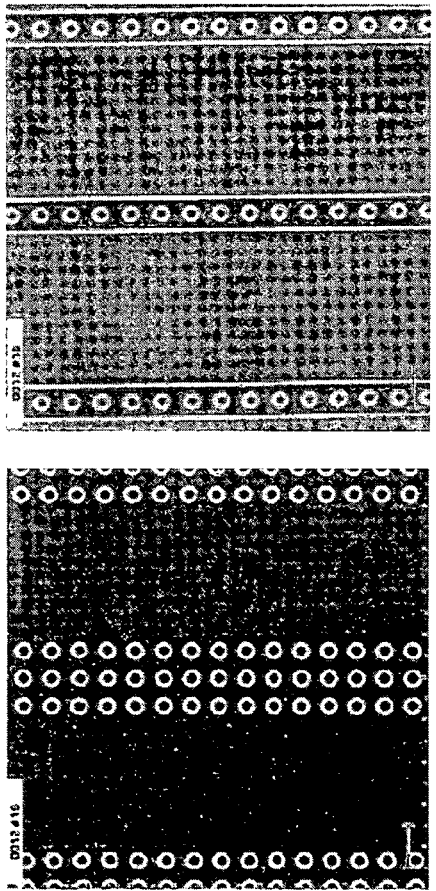
FIG. 4A
FIG. 4B
After trench etch
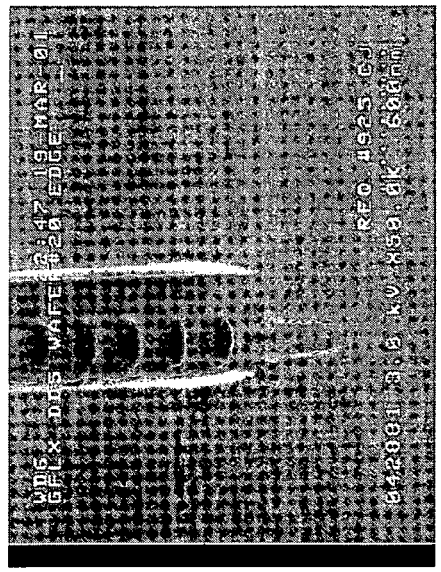
FIG. 4C

DUAL LAYER BARRIER FILM TECHNIQUES TO PREVENT RESIST POISONING

CROSS-REFERENCE TO RELATED APPLICATION

This is a divisional of U.S. patent application Ser. No. 10/893,659 filed Jul. 16, 2004 now U.S. Pat. No. 7,071,094, titled DUAL LAYER BARRIER FILM TECHNIQUES TO PREVENT RESIST POISONING, which is a continuation of U.S. patent application Ser. No. 09/896,363 (now U.S. Pat. No. 6,812,134) filed Jun. 28, 2001, titled DUAL LAYER BARRIER FILM TECHNIQUES TO PREVENT RESIST POISONING; the disclosures of which are incorporated herein by reference in their entirety and for all purposes.

BACKGROUND OF THE INVENTION

1. Field of the Invention

The present invention relates to techniques for forming barrier layers to prevent resist poisoning in dual damascene structures in semiconductor devices.

2. Description of the Related Art

As features become smaller in semiconductor devices, it becomes more desirable to reduce interconnection delays through the selection of materials used in the interconnects and associated dielectric layers. The propagation delays through the interconnects are proportional to the resistance of the interconnects and the capacitance offered by the dielectric. In order to minimize the delays low resistance conductors such as copper are typically used in the interconnects. Significant recent efforts have been directed to the selection of appropriate low-k dielectric materials to reduce the capacitance and thereby reduce the interconnect propagation delays.

One drawback to the use of copper in the interconnects and metallization conductor is its tendency to poison adjacent dielectric layers. Copper diffuses easily into dielectric layers and barrier layers and diminishes the electrical insulation qualities of the dielectric. Incorporating nitrogen into a dielectric barrier layer is commonly employed method to reduce this electrical leakage. Particularly when silicon carbide is used as a barrier layer, doping the barrier layer with nitrogen is known to significantly diminish the amount of electrical leakage into the barrier.

Low-k dielectric material layers exhibit lower dielectric constants than silicon oxides. These improvements are generally related to the increased porosity of the low-k materials. In part due to the increased porosity, the low-k materials are particularly prone to diffusion of nitrogen from adjacent barrier films. During the formation of trenches and vias, photoresist masks are used to control the locations of etches. Frequently, nitrogen from the barrier layers diffuses into the photoresist and poisons the mask. This poisoning prevents full development of the mask. As a result, residual portions of the photoresist fail to dissolve and remain in the trench or via. During subsequent etching of the trench in a via-first dual damascene approach to interlayer interconnects, the photoresist residue will prevent the formation of a trench having the desired shape or result in other defects. Often, the residue combines with the etch chemicals to mushroom. Thus, the residue resulting from the photoresist poisoning produces a defective trench.

Accordingly, it is desirable to prevent the nitrogen from combining with photoresist materials so that trenches and vias may be formed in techniques such as dual damascene schemes without defects caused by the poisoned photoresist residue.

SUMMARY OF THE INVENTION

To achieve the foregoing, the present invention provides a process for forming a barrier film to prevent resist poisoning in a semiconductor device by depositing a second nitrogen-free barrier layer on top of a first barrier layer containing nitrogen. A low-k dielectric layer is subsequently formed over the second barrier layer. This technique maintains the low electrical leakage characteristics of the first barrier layer and reduces nitrogen poisoning of the photoresist layer. One application of the present invention is the process of forming dual damascene interconnect structures. Nitrogen poisoning present in conventional methods results in the formation of defects in the trench formation from residual photoresist mask material.

In one aspect, the invention provides a process for preventing resist poisoning in a semiconductor device. A first barrier layer containing silicon carbide and nitrogen is deposited on a surface located to control electrical leakage from a conductor. A nitrogen-free second barrier layer is deposited on top of the first barrier layer. A low-k dielectric layer is formed over the second barrier layer. A photoresist layer is formed and etched to form a photoresist mask covering at least a portion of the low-k dielectric layer.

In another aspect, the invention provides a process of forming a dual damascene structure in a semiconductor device using a nitrogen-free second barrier layer. The process involves first forming a via into the first low-k dielectric layer. A photresist mask is formed and the second low-k dielectric layer is etched to form a trench.

In another aspect, the invention provides a dual damascene process of forming an interconnect using a nitrogen doped first barrier layer and a nitrogen-free second barrier layer. Both barrier layers are formed using the same tool.

These and other features and advantages of the present invention are described below with reference to the drawings.

BRIEF DESCRIPTION OF THE DRAWINGS

FIGS. 2F'-2I' depict stages in the trench first dual damascene process of forming a semiconductor device having a trench and via in accordance with one embodiment of the present invention.

FIGS. 2E"-2H" depict stages in the buried via dual damascene process of forming a semiconductor device having a trench and via in accordance with one embodiment of the present invention.

FIGS. 3A-3C are SEM photographs showing resist poisoning using conventional SiC barrier films incorporating nitrogen.

FIGS. 4A-4C are SEM photographs showing the formation of trenches using a dual layer barrier stack in accordance with one example of an implementation of the present invention.

DETAILED DESCRIPTION OF PREFERRED EMBODIMENTS

Reference will now be made in detail to preferred embodiments of the invention. Examples of the preferred embodiments are illustrated in the accompanying drawings. While the invention will be described in conjunction with these preferred embodiments, it will be understood that it is not intended to limit the invention to such preferred embodiments. On the contrary, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details. In other instances, well known process operations have not been described in detail in order not to unnecessarily obscure the present invention.

The present invention provides a process for forming a barrier film to prevent resist poisoning in a semiconductor device by depositing a second nitrogen-free barrier layer on top of a first barrier layer containing nitrogen. A low-k dielectric layer is formed over the second barrier layer. This technique maintains the low electrical leakage characteristics of the first barrier layer and reduces nitrogen poisoning of the photoresist layer. One application of the present invention is the process of forming dual damascene interconnect structures. Nitrogen poisoning present in conventional methods results in the formation of defects in the trench formation from photoresist mask material.

The formation of the dual layer barrier film, in one embodiment, is used to prevent nitrogen poisoning of the trench photoresist mask in the formation of a dual damascene via structure. Alternative embodiments relate to the use of a dual barrier SiC barrier layer in various via formation methods, including via first, buried via, and trench first, methods.

While not wishing to be bound by any particular theory, in one example it is believed that nitrogen from nitrogen containing barrier films readily diffuses into the relatively porous low-k dielectric layers to cause resist poisoning. At a subsequent stage, the nitrogen is released from the low-k dielectric film and interacts with the exposed photoresist layer. Resist poisoning is believed to be caused by the reaction of nitrogen based byproducts with the photoresist, preventing the dissolution of the resist during the development step of the photoresist.

Figure 1:
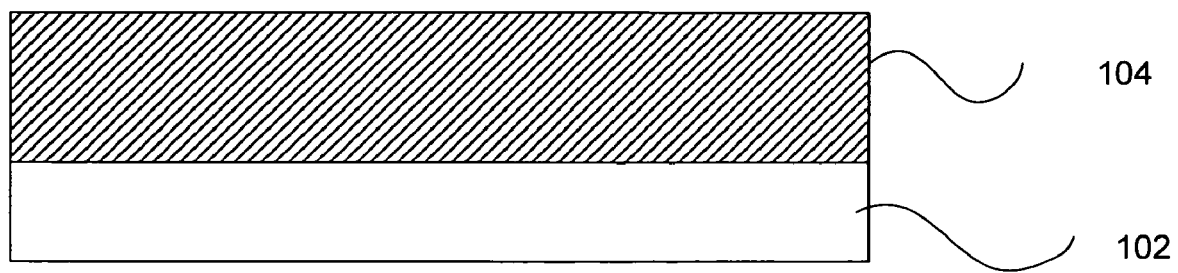
FIG. 1 depicts a dual layer SiC barrier layer in accordance with one embodiment of the present invention.

FIG. 1 shows a perspective view of a 2-layer SiC barrier stack in accordance with one embodiment of the present invention. Silicon carbide ("SiC") barrier films doped with nitrogen have experienced increasing utilization as barrier layers, especially for low-k stacks. SiC barrier layers typically exhibit dielectric constant ("k") values approximating 5.0, compared to k values of about 7.0 for SiN barrier layers which had been typically used in the past. Thus, the overall dielectric constant value of the stack can be reduced through the selection of SiC as a barrier layer and the overall capacitance of the interconnect reduced. The bottom barrier layer 102 is formed by conventional methods and is doped with nitrogen to reduce electrical leakage from an adjacent metal layer(s). A nitrogen-free barrier layer 104 is deposited on top of the first barrier layer 102 and may be formed using the same tool as used to form the first layer. The nitrogen-free barrier layer 104 reduces the diffusion or outgassing of nitrogen from barrier layer 102 into or through the overlying layers which may include low-k dielectric layers and photoresist layers, thus preventing nitrogen poisoning of the photoresist.

Figure 2A:
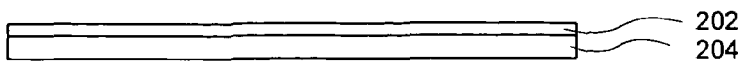
FIGS. 2A-2J depict stages in the via-first dual damascene process of forming a semiconductor device having a trench and via in accordance with one embodiment of the present invention.
Figure 2B:
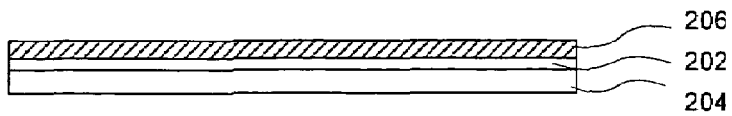

FIGS. 2A-2H depict stages in the fabrication of a trench structure in a semiconductor device using a "via first" dual damascene process. The process begins, as shown in FIG. 2A, with the formation of a first barrier layer 202 containing silicon carbide and nitrogen over a first metal layer 204. The first barrier layer 202 may be formed by plasma enhanced chemical vapor deposition ("PECVD") methods with some flexibility provided in the selection of the chemical precursors. According to this technique, a variety of liquid or gas precursors that contain the methyl group may be used to form the silicon carbide barrier layer, as is well known in the art. For example, the silicon carbide layer may be formed by injecting an $SiH_x(CH_3)_y$ gas, where x is chosen in the range of 1 to 4, and x+y=4. Such methyl-containing precursors, known in the art as 3MS, 4MS, or 1MS, for example, provide satisfactory results. An inert gas such as Helium or Argon may be selected as the carrier gas. Nitrogen doping into the barrier layer results from providing a flow of an ambient gas, either ammonia ($NH_3$), nitrogen ($N_2$), or nitrogen oxide ($N_2O$).

Formation of the nitrogen-doped silicon carbide barrier layer is followed by a deposition of a low-k dielectric film in conventional methods. However, in accordance with the present invention, a second, nitrogen-free, barrier layer 206 is deposited on top of the first barrier layer 202 to form a dual barrier layer stack. The nitrogen-free barrier layer, in one embodiment, may be formed by using the same chemical precursors as used to form the nitrogen doped SiC barrier layer except turning off the nitrogen gas source. This feature permits both layers to be formed in the same tool. Given this guidance, individual parameters would be optimized by one of ordinary skill in the art with minimal experimentation to optimize fabrication of a particular semiconductor device feature in order to avoid resist poisoning during trench mask and to prevent significant deterioration of the copper barrier properties such as leakage current and time to breakdown. Suitable SiC process parameters fall within the following ranges: temperature 300° C.-450° C.; pressure 1-10 torr; RF power 200 w-700 w; $SiH_x(CH_3)_y$ flow of 100-600 sccm and He or Ar flow of 100-1000 sccm.

The thickness of the first barrier film 202 and the second nitrogen-free barrier film 206 may be varied in order to optimize the resist poisoning characteristics. The range may be optimized by one of skill in the art depending on the particular features of the semiconductor device being fabricated. In one embodiment, a thickness of the second barrier layer 206 of one quarter the first layer 202 thickness may be used in accordance with the present invention.

Figure 2C:
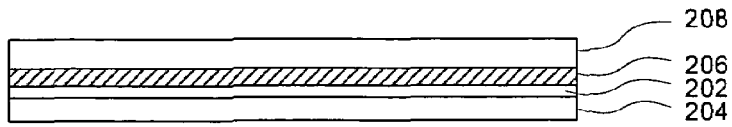

A low-k dielectric layer 208 is then formed over the dual barrier layer stack (202, 206) as shown in FIG. 2C. The low-k dielectric layer may be formed by various methods known to those of skill in the art, including a PECVD process, a spin-on process, and a flow-fill process. The low-k dielectric layer may be SiCOH or some other dielectric composition formed using silicon, carbon, oxygen and hydrogen, such as are known in the art. Low-k materials exhibit increased porosity in comparison to conventional silicon oxide dielectric layers. This porosity, however, facilitates the diffusion of the nitrogen from conventional barrier layers. Such low-k dielectric materials may exhibit k values of 2.8 or lower (compared to conventional dielectrics (e.g. $SiO_2$) which exhibit k values of about 4.0 or more). For example, low-k organosilicate films have shown k values ranging from 2.6 to 2.8. Low-k dielectrics are well known in the art and are discussed, for example, in "Designing Porous Low-k Dielectrics," Semiconductor International (May 2001), incorporated by reference herein in its entity.

Figure 2D:
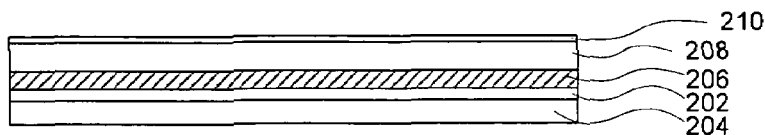
Figure 2E:
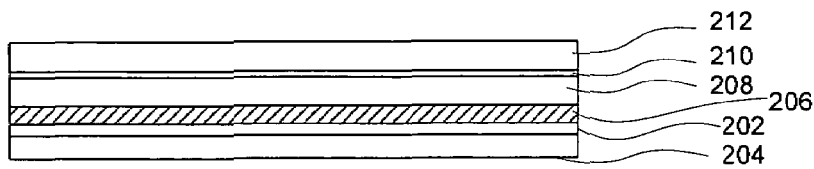
Figure 2F:
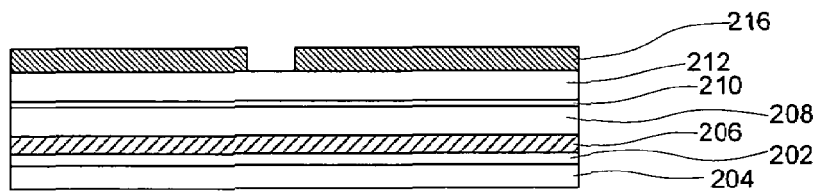

An etch stop layer 210 is then deposited on top of the low-k dielectric layer 208 as shown in FIG. 2D. The etch stop layer 210 is selective to the low-k dielectric material. Nitrogen-free SiC materials are commonly used as etch stops. As shown in FIG. 2E, a second low-k dielectric layer 212 is then deposited on top of the etch stop 210 to facilitate fabrication of the dual damascene structure. A photoresist layer is then deposited on the stack as shown in FIG. 2F, and patterned to form a mask 216. A via 218 is etched through the two low-k dielectric layers 208 and 212 as well as etch stop 210 (See FIG. 2G). This may be achieved through the use of an anisotropic etch such as a plasma dry etch.

Figure 2G:
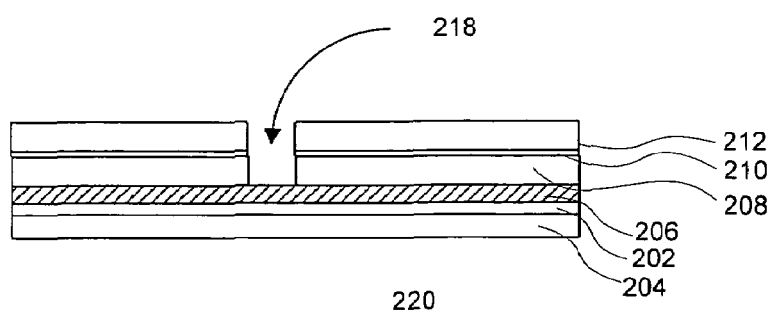
Figure 2H:
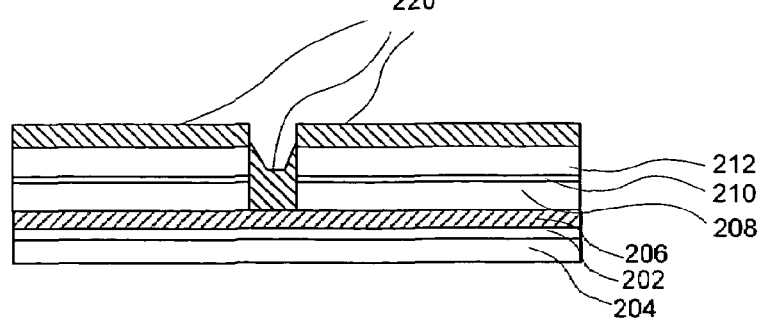
Figure 2I:
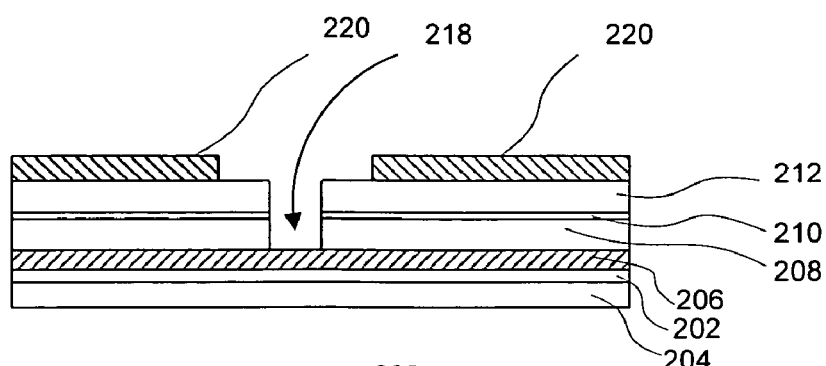
Figure 2J:
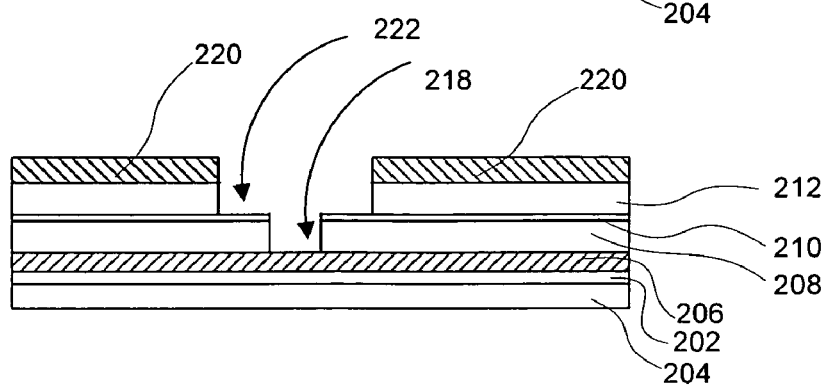
Figure 2F:
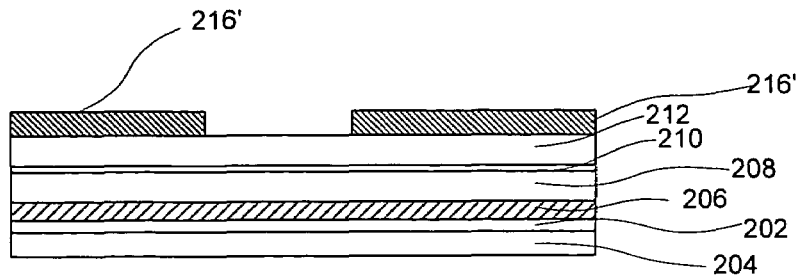
Figure 2G:
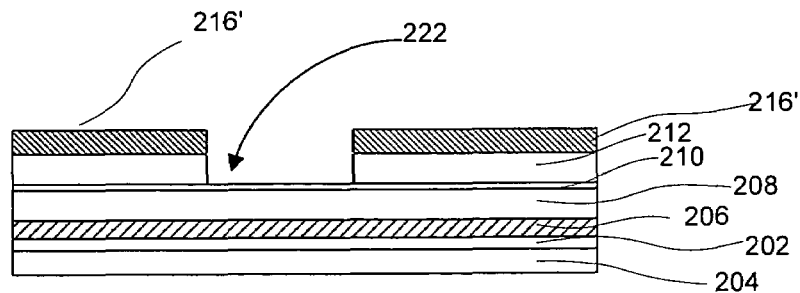
Figure 2H:
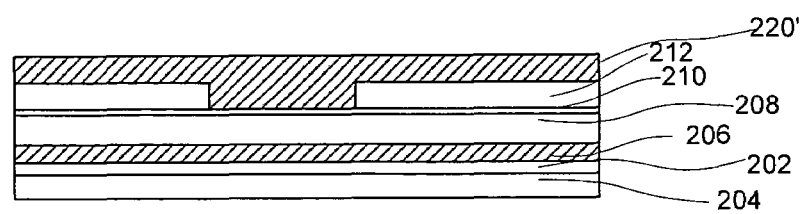
Figure 2I:
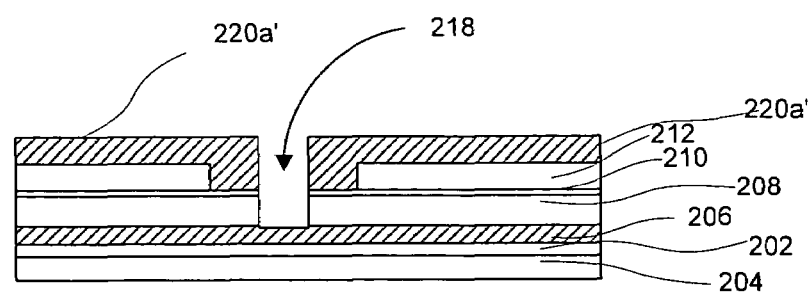

The photoresist mask 216 is removed following formation of the via. A BARC layer (bottom anti reflective coating) (not shown) may then be deposited in the via to protect the bottom SiC barrier layer of the via from opening during trench etch (and having the underlying copper sputtered). ***Then a second photoresist layer 220 is deposited to pattern and etch a trench. In this step as practiced in conventional processing without the nitrogen-free barrier, the photoresist in the via would be exposed to nitrogen present in the low-k dielectric layers 208 and 212 (from the nitrogen doped barrier layer). The anti-reflective layer (BARC—not shown) which, if present, is deposited immediately before the photoresist layer 220, and would not prevent nitrogen present in the low-k dielectric layer from diffusing into and poisoning the photoresist 220 in conventional processing. Continuing with the process of the present invention, the second photoresist layer 220 is patterned and etched to form the trench 222 as shown in FIGS. 2I and 2J. Etching stops on the etch stop layer 210 to form the trench and via structure shown in FIG. 2J. In subsequent steps well known to those of ordinary skill in the art, the photoresist mask 220 is removed as well as the barrier layers (202, 206) adjacent to the metal layer 204. According to standard processing techniques, the via and trench will typically then be filled with copper by electrochemical deposition.

Where the via is formed in accordance with the process described with reference to FIGS. 2A-2J, the nitrogen-free silicon carbide barrier layer 206 prevents nitrogen in the nitrogen-doped silicon carbide barrier layer 202 from diffusing into the low-k dielectric layer 208 and the ultimate combination of the nitrogen with the photoresist materials 216, 220. Thus, the reaction of the resist with nitrogen from the low-k dielectric layer in conventional processing which prevents the photoresist 216, 220 from completely developing is avoided. In accordance with the processes of the present invention, the photoresist 216, 220 completely develops and dissolves without leaving residue that would cause defects in the trench or via.

The foregoing process, as specifically illustrated in FIGS. 2A-2J, describes the formation of a trench structure according to a "via first" process in accordance with one embodiment of the present invention. The via first sequence is but one of several dual damascene approaches to connect one layer of metal to the overlying or underlying metal layer or transistor contact. The dual barrier process of the present invention to prevent photoresist poisoning is applicable to any dual damascene technique, such as are well known in the art. A review of dual damascene processing techniques in provided in the article "Dual Damascene: Overcoming process issues," Semiconductor International (June, 2000), incorporated by reference herein in its entirety.

Two of these alternative dual damascene processes are "trench first" and a self-aligned process ("buried via"). In the "trench first" process, the initial process steps are identical to those used in the via-first technique as illustrated in FIGS. 2A-2E. As shown in FIGS. 2F' and 2G', a trench 222 is then formed using a photoresist mask 216' and etched through the top low-k dielectric layer 212 shown in FIG. 2G', stopping on the etch stop layer 210. Photoresist mask 216' is then removed and a second photoresist layer 220' is deposited on top of the trench 222 and the top low-k dielectric layer 212 (See FIG. 2H'). The photoresist layer is patterned to form the via mask 220a'. In patterning, the via mask 220a' is aligned with the trench 222 and the etch chemicals etch through the bottom low-k dielectric layer 208 shown in FIG. 2I' to form the via 218. Subsequent steps are identical to those described above with respect to the via-first process, and the structure produced by this approach is equivalent to the structure produced by the via first technique described above.

The "buried via" approach involves the deposition of an etch stop layer on both the top and bottom of the low-k dielectric layer. The initial sequence of steps employed by the buried via process is identical to those employed in the via first process, as illustrated in FIGS. 2A-2D. As shown in FIGS. 2E" and 2F", after the first low-k dielectric layer 208 and etch stop layer 210 are deposited, a photoresist layer is deposited and patterned to form via mask 213". Then etch stop layer 210, typically SiC, is etched to form a via hardmask with a via mask opening 211 for the via. In a subsequent step as shown in FIG. 2G", the low-k dielectric layer 212" is deposited over the etch stop layer 210 and fills the via mask opening 211. A photoresist layer is deposited on the low-k dielectric 212" and patterned to form a trench mask 220a". As shown in FIG. 2H", the trench mask is aligned with the via mask opening 211 (buried under the top dielectric layer) and both the trench 222 and via 218 are formed by etching through both dielectric layers with one etch step to produce the structure shown in FIG. 2J. The structure produced by this approach is equivalent to the structure produced by the via first and trench first techniques described above.

EXAMPLE

The following example provides details concerning techniques and structures which demonstrate an implementation in accordance with the present invention. It should be understood the following is representative only, and that the invention is not limited by the detail set forth in this example.

A thin non nitrogen film was formed on top of a standard nitrogen doped SiC barrier film (CIP BLOK film manufactured by Applied Materials) to prevent resist poisoning. The process sequence involved depositing a conventional nitrogen doped SiC barrier film with a thickness of 40 nm using an Applied Material's Producer system. The barrier layer was formed at a temperature of 350° C. and a pressure of 3 Torr. Applied RF power in this PECVD process was 300 Watts. Helium was used as the carrier gas.

The nitrogen gas source, using the same tool, was turned off and the deposition of the barrier film (a nitrogen free-layer) continued for a thickness of 10 nm, approximately one quarter the thickness of the conventional nitrogen doped SiC film layer. A via first dual damascene scheme was used to form the trench and via for the interconnect. The via first dual damascene scheme was carried out using two methods, conventional single nitrided barrier films and the dual layer stack technique of the present invention.

The experimental data show elimination of photoresist poisoning using the dual barrier layer of the present invention. FIGS. 3A-3C are scanning electron microscope (SEM) photographs showing resist poisoning using conventional SiC barrier films incorporating nitrogen. Mushrooming and scrumming caused by resist poising are evident in FIGS. 3A-3B, and the dual darnascene structure after trench etch is not well defined, as seen in FIG. 3C. FIGS. 4A-4C are SEM photographs showing the formation of trenches using a dual layer barrier stack in accordance with one example of an implementation of the present invention. As shown in FIGS. 4A and 4B, after trench patterning, via holes are well defined, and no mushrooming or scrumming caused by resist poising is observed. As shown in FIG. 4C, after trench etch, the dual damascene structure is well defined.

CONCLUSION

In summary, forming a barrier film stack using a second nitrogen-free barrier deposited on top of a conventional nitrogen doped SiC barrier layer avoids problems caused by photoresist poisoning such as from nitrogen diffusing through a low-k dielectric material.

Although the foregoing invention has been described in some detail for purposes of clarity of understanding, it will be apparent that certain changes and modifications may be practiced within the scope of the appended claims. For example, the process of the present invention is applicable to any scheme where photoresist comes into contact with a low-k material in a semiconductor fabrication process. Accordingly, the present embodiments are to be considered as illustrative and not restrictive, and the invention is not to be limited to the details given herein, but may be modified within the scope and equivalents of the appended claims.

What is claimed is:

1. A dual damascene semiconductor device structure comprising:
    a substrate having a metallization layer formed thereon;
    a first barrier layer containing silicon carbide and nitrogen formed on the substrate such that it covers at least a portion of the metallization layer;
    a nitrogen-free second barrier layer formed on top of the first barrier layer to reduce the effects of nitrogen poisoning in subsequently formed photoresist layers;
    a first low-k dielectric layer formed on the second barrier layer;
    an etch stop layer deposited on top of the second barrier layer;
    a second low-k dielectric layer deposited on top of the etch stop layer;
    a via formed such that it extends through the first and second low-k dielectric layers but does not substantially extend into the underlying barrier layers;
    a trench formed such that it extends through the second low-k dielectric layer but not into the first low-K dielectric layer; and
    a conductive material filling the via and trench but does not substantially extend into the underlying barrier layers.

2. The dual damascene semiconductor device structure of claim 1 wherein the nitrogen-free second barrier layer on top of the first barrier layer comprises a nitrogen-free silicon carbide layer.

3. The dual damascene semiconductor device structure of claim 1 wherein a first barrier layer containing silicon carbide and nitrogen is deposited using a PECVD process and one of $NH_3$, $N_2$, and $N_2O$ as a chemical precursor to supply the nitrogen and a nitrogen-free second barrier layer is formed by turning off the supply of nitrogen.

4. The dual damascene semiconductor device structure of claim 1 wherein the nitrogen-free second barrier layer is formed by injecting an $SiH_x(CH_3)_y$ gas, where x is chosen in the range of 1 to 4, and x+y=4.

5. The dual damascene semiconductor device structure of claim 1 further comprising copper deposited in the trench and the via.

6. The dual damascene semiconductor device structure of claim 5 wherein the copper is deposited by an electrochemical process to fill the via and the trench.

* * * * *